United States Patent
Murase

(10) Patent No.: US 10,050,601 B2
(45) Date of Patent: Aug. 14, 2018

(54) ELASTIC WAVE APPARATUS

(71) Applicant: Murata Manufacturing Co., Ltd., Nagaokakyo-shi, Kyoto-fu (JP)

(72) Inventor: Tomohiko Murase, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/622,176

(22) Filed: Jun. 14, 2017

(65) Prior Publication Data

US 2017/0279432 A1 Sep. 28, 2017

Related U.S. Application Data

(63) Continuation of application No. PCT/JP2016/050242, filed on Jan. 6, 2016.

(30) Foreign Application Priority Data

Jan. 7, 2015 (JP) .................... 2015-001574

(51) Int. Cl.
*H03H 9/145* (2006.01)
*H03H 9/54* (2006.01)
(Continued)

(52) U.S. Cl.
CPC .............. *H03H 9/145* (2013.01); *H03H 9/09* (2013.01); *H03H 9/15* (2013.01); *H03H 9/25* (2013.01); *H03H 9/54* (2013.01); *H03H 9/64* (2013.01)

(58) Field of Classification Search
CPC ............ H03H 9/145; H03H 9/09; H03H 9/15; H03H 9/25; H03H 9/54; H03H 9/64
(Continued)

(56) References Cited

U.S. PATENT DOCUMENTS

| 2008/0122557 A1* | 5/2008 | Kando | H03H 9/0222 333/193 |
| 2008/0129418 A1* | 6/2008 | Miura | H03H 9/6483 333/195 |

(Continued)

FOREIGN PATENT DOCUMENTS

| JP | 63-86912 A | 4/1988 |
| JP | 07-7369 A | 1/1995 |

(Continued)

OTHER PUBLICATIONS

Official Communication issued in International Patent Application No. PCT/JP2016/050242, dated Feb. 16, 2016.

*Primary Examiner* — Stephen E Jones
*Assistant Examiner* — Scott S Outten
(74) *Attorney, Agent, or Firm* — Keating & Bennett, LLP

(57) ABSTRACT

An elastic wave apparatus includes a piezoelectric substrate, an IDT electrode on the piezoelectric substrate and includes first electrode fingers, second electrode fingers, a first busbar, and a second busbar, a capacitive electrode including third electrode fingers, fourth electrode fingers, a third busbar, and a fourth busbar, an insulating film laminated on the capacitive electrode, a first wiring line including a first portion facing the capacitive electrode via the insulating film, and a second wiring line that connects the first busbar and the third busbar. The capacitive electrode extends in a lateral direction with respect to the IDT electrode in a surface acoustic wave propagation direction.

20 Claims, 8 Drawing Sheets

(51) Int. Cl.
*H03H 9/64* (2006.01)
*H03H 9/09* (2006.01)
*H03H 9/15* (2006.01)
*H03H 9/25* (2006.01)

(58) Field of Classification Search
USPC .......................................................... 333/195
See application file for complete search history.

(56) References Cited

U.S. PATENT DOCUMENTS

2008/0258983 A1* 10/2008 Bauer .................. H03H 9/6409
343/722
2009/0289745 A1 11/2009 Bauer et al.

FOREIGN PATENT DOCUMENTS

| JP | 2004-289051 A | 10/2004 |
| JP | 2005-260833 A | 9/2005 |
| JP | 2009-218761 A | 9/2009 |
| JP | 2010-512077 A | 4/2010 |
| WO | 2014/034492 A1 | 3/2014 |

* cited by examiner

ELASTIC WAVE APPARATUS

CROSS REFERENCE TO RELATED APPLICATIONS

This application claims the benefit of priority to Japanese Patent Application No. 2015-001574 filed on Jan. 7, 2015 and is a Continuation Application of PCT Application No. PCT/JP2016/050242 filed on Jan. 6, 2016. The entire contents of each application are hereby incorporated herein by reference.

BACKGROUND OF THE INVENTION

1. Field of the Invention

The present invention relates to an elastic wave apparatus.

2. Description of the Related Art

Elastic wave apparatuses have been widely used in, for example, cellular phones.

Japanese Unexamined Patent Application Publication No. 63-86912 discloses a surface acoustic wave apparatus including a capacitance portion in which a comb-shaped electrode is used. A plurality of electrode fingers of the comb-shaped electrode are connected to an IDT electrode, are formed on a piezoelectric substrate, and face a common electrode via a dielectric film, so that the capacitance portion is formed.

Japanese Unexamined Patent Application Publication No. 2010-512077 discloses a filter including a capacitance portion that includes a pair of comb-shaped electrodes. The filter disclosed in Japanese Unexamined Patent Application Publication No. 2010-512077 includes a longitudinally coupled resonator-type elastic wave filter and a reactance element. The above-described capacitance portion is connected between a ground potential and a node between the longitudinally coupled resonator-type elastic wave filter and the reactance element. A direction in which electrode fingers of the capacitance portion extend is perpendicular to a direction in which electrode fingers of IDT electrodes in the longitudinally coupled resonator-type elastic wave filter extend.

However, the electrode fingers in the capacitance portion disclosed in Japanese Unexamined Patent Application Publication No. 63-86912 extend in a direction that is the same as a direction in which electrode fingers of the IDT electrode extend. The electrode fingers in the capacitance portion therefore excite an unnecessary wave. This leads to degradation in filter characteristic.

In current years, reduction in size of elastic wave apparatuses is required. However, in the case of the filter disclosed in Japanese Unexamined Patent Application Publication No. 2010-512077, it is difficult to reduce the size of the filter because the capacitance portion is provided.

SUMMARY OF THE INVENTION

Preferred embodiments of the present invention provide elastic wave apparatuses that achieve size reduction.

An elastic wave apparatus according to a preferred embodiment of the present invention includes a piezoelectric substrate, an IDT electrode that is provided on the piezoelectric substrate and includes a plurality of first electrode fingers and a plurality of second electrode fingers which interdigitate with each other, a first busbar to which first ends of the first electrode fingers are connected in common, and a second busbar to which first ends of the second electrode fingers are connected in common, a capacitive electrode including a plurality of third electrode fingers and a plurality of fourth electrode fingers which interdigitate with each other, a third busbar to which first ends of the third electrode fingers are connected in common, and a fourth busbar to which first ends of the fourth electrode fingers are connected in common, an insulating film laminated on the capacitive electrode, a first wiring line including a portion facing the capacitive electrode via the insulating film, and a second wiring line that connects the first busbar and the third busbar. The capacitive electrode extends in a lateral direction with respect to the IDT electrode in a surface acoustic wave propagation direction.

In an aspect of an elastic wave apparatus according to a preferred embodiment of the present invention, an elastic wave apparatus further includes a third wiring line that connects the second busbar and the fourth busbar. In this case, the capacitive electrode is connected in parallel to the IDT electrode. An electrostatic capacitance is therefore able to be added to the IDT electrode.

In another aspect of an elastic wave apparatus according to a preferred embodiment of the present invention, the fourth busbar is connected to a ground potential. In this case, an electrostatic capacitance is able to be provided between the IDT electrode and the ground potential.

In still another aspect of an elastic wave apparatus according to a preferred embodiment of the present invention, the first wiring line is connected to the fourth busbar. In this case, a larger electrostatic capacitance is able to be provided between the IDT electrode and the ground potential.

In still another aspect of an elastic wave apparatus according to a preferred embodiment of the present invention, the capacitive electrode is located so that a cross width direction of the third electrode fingers and the fourth electrode fingers is not parallel to a cross width direction of the first electrode fingers and the second electrode fingers. In this case, the effect of a surface acoustic wave excited in the capacitive electrode upon the IDT electrode is effectively reduced.

In still another aspect of an elastic wave apparatus according to a preferred embodiment of the present invention, the capacitive electrode is located so that a cross width direction of the third electrode fingers and the fourth electrode fingers is perpendicular or substantially perpendicular to a cross width direction of the first electrode fingers and the second electrode fingers. In this case, the effect of a surface acoustic wave excited in the capacitive electrode upon the IDT electrode is more effectively reduced.

In still another aspect of an elastic wave apparatus according to a preferred embodiment of the present invention, the portion of the first wiring line facing the capacitive electrode is provided on the piezoelectric substrate. In this case, since the insulating film is laminated on the flat upper surface of first wiring line, the upper surface of the insulating film is also flat. The capacitive electrode is therefore able to be easily provided.

In still another aspect of an elastic wave apparatus according to a preferred embodiment of the present invention, the capacitive electrode is provided on the piezoelectric substrate. In this case, the capacitive electrode is able to be easily provided.

In still another aspect of an elastic wave apparatus according to a preferred embodiment of the present invention, the insulating film is made of an insulating material having no piezoelectricity. In this case, even in a case where the insulating film is provided on the capacitive electrode, the upper surface of the insulating film is flat. The first wiring line is therefore able to be easily provided on the insulating film.

In still another aspect of an elastic wave apparatus according to a preferred embodiment of the present invention, the elastic wave apparatus is a ladder filter including at least one series arm resonator and at least one parallel arm resonator, and at least one of the series arm resonator and the parallel arm resonator includes the IDT electrode. In this case, as a result of provision of an electrostatic capacitance to at least one of the series arm resonator and the parallel arm resonator performed by the capacitive electrode, the steepness around the end portion of a passband of the elastic wave apparatus on at least one of a higher-frequency side and a lower-frequency side is able to be effectively increased.

According to various preferred embodiments of the present invention, elastic wave apparatuses that achieve size reduction are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

The preferred embodiments are merely illustrative, and components according to different preferred embodiments may be partially exchanged or combined.

Figure 1:
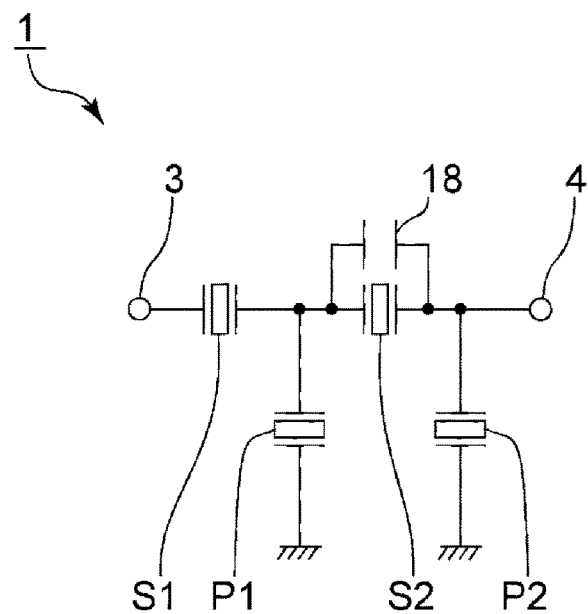
FIG. 1 is a circuit diagram of an elastic wave apparatus according to a first preferred embodiment of the present invention.

FIG. 1 is a circuit diagram of an elastic wave apparatus according to a first preferred embodiment of the present invention.

An elastic wave apparatus 1 preferably is a ladder filter, for example. The elastic wave apparatus 1 includes series arm resonators S1 and S2 connected between an input terminal 3 and an output terminal 4. Between a ground potential and a node between the series arm resonators S1 and S2, a parallel arm resonator P1 is connected. Between a ground potential and a node between the series arm resonator S2 and the output terminal 4, a parallel arm resonator P2 is connected. A capacitance portion 18 is connected in parallel to the series arm resonator S2. The capacitance portion 18 includes a capacitive electrode to be described later, an insulating film, and a first wiring line facing the capacitive electrode via the insulating film. The first wiring line connects the parallel arm resonator P1 to the ground potential.

The configuration of an elastic wave apparatus according to this preferred embodiment will be described in more detail below with reference to FIGS. 2 to 5.

Figure 2:
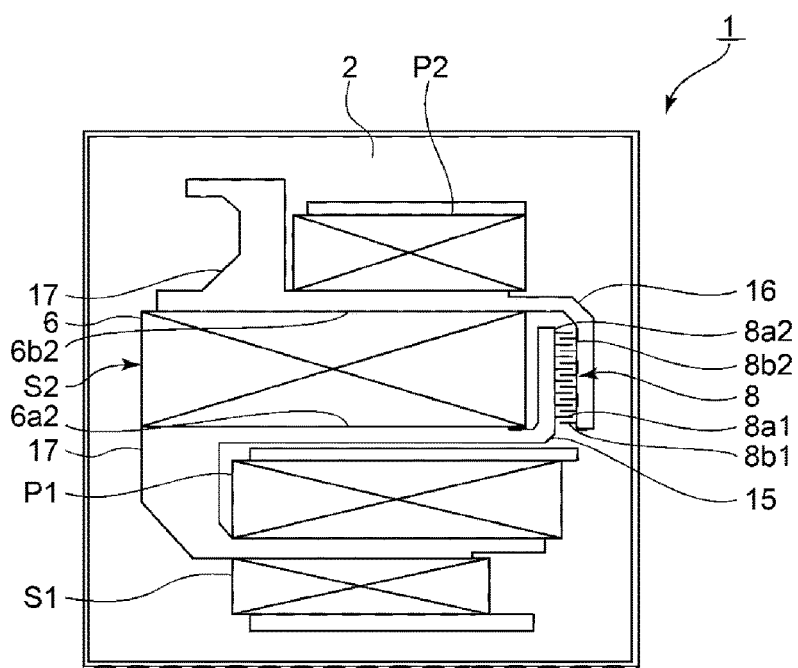
FIG. 2 is a schematic plan view illustrating a state where a first conductive layer is provided on a piezoelectric substrate in the first preferred embodiment of the present invention.
Figure 3:
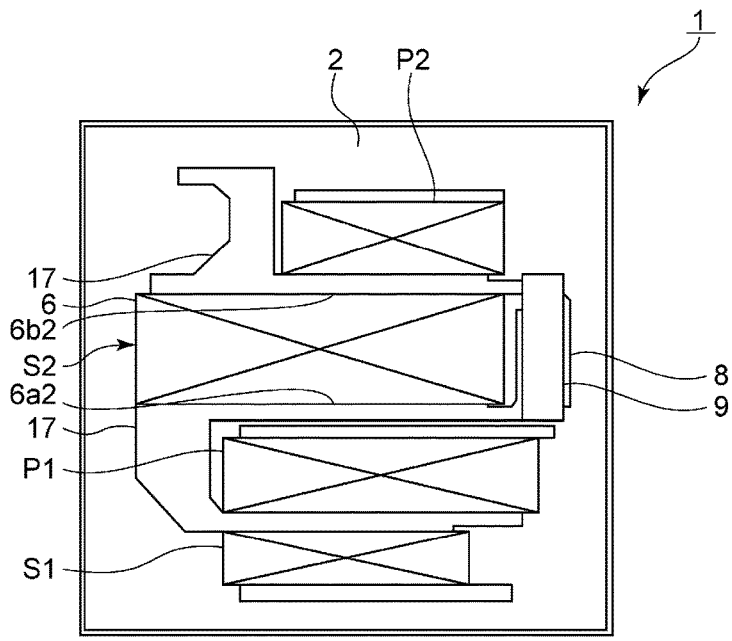
FIG. 3 is a schematic plan view illustrating a state where an insulating film is provided on the first conductive layer illustrated in FIG. 2 in the first preferred embodiment of the present invention.
Figure 4:
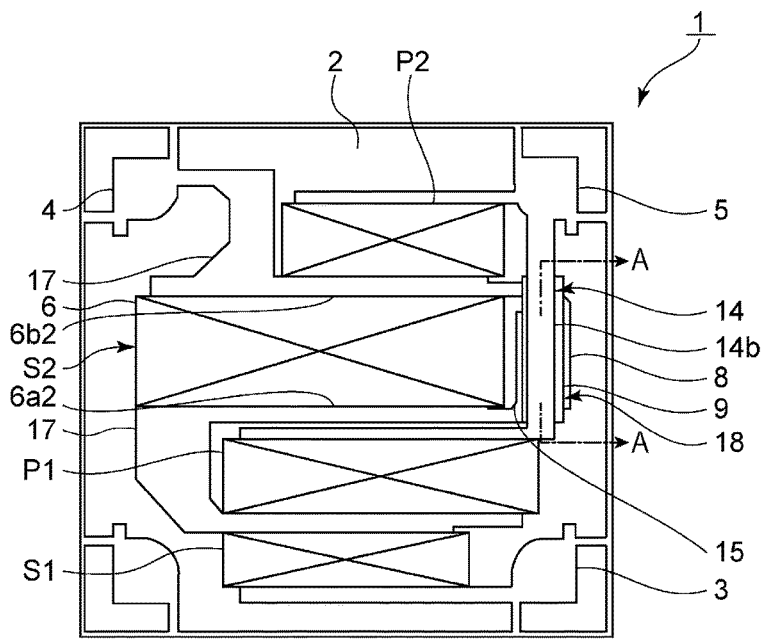
FIG. 4 is a schematic plan view of an elastic wave apparatus according to the first preferred embodiment of the present invention.

FIG. 4 is a schematic plan view of an elastic wave apparatus according to this preferred embodiment. FIGS. 2 and 3 are diagrams illustrating configurations at stages during the process of manufacturing an elastic wave apparatus according to this preferred embodiment. More specifically, FIG. 2 is a schematic plan view illustrating a state where a first conductive layer to be described below is provided on a piezoelectric substrate and FIG. 3 is a schematic plan view illustrating a state where an insulating film is provided on the first conductive layer illustrated in FIG. 2.

As illustrated in FIGS. 2 to 4, the elastic wave apparatus 1 includes a piezoelectric substrate 2. The piezoelectric substrate 2 is made of piezoelectric monocrystal such as $LiNbO_3$ or $LiTaO_3$, or may be made of piezoelectric ceramic.

On the piezoelectric substrate 2, the series arm resonators S1 and S2 and the parallel arm resonators P1 and P2 are provided. A capacitive electrode 8 is provided in a lateral direction with respect to the series arm resonator S2. The series arm resonators S1 and S2 and the parallel arm resonators P1 and P2 are connected via a connection wiring line 17. In this specification, each of the series arm resonators S1 and S2 and the parallel arm resonators P1 and P2 is represented by a rectangular or substantially rectangular region in which two diagonal lines are drawn.

Figure 5:
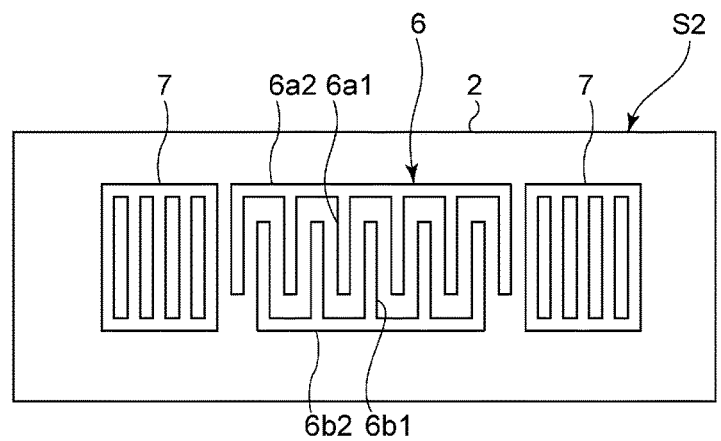
FIG. 5 is a plan view of a series arm resonator used in the first preferred embodiment of the present invention.

FIG. 5 is a plan view of the series arm resonator S2.

On the piezoelectric substrate 2, the IDT electrode 6 is provided. The IDT electrode 6 includes a plurality of first electrode fingers 6a1, a plurality of second electrode fingers 6b1, a first busbar 6a2, and a second busbar 6b2. The first electrode fingers 6a1 and the second electrode fingers 6b1 interdigitate with each other in a cross width direction. First ends of the first electrode fingers 6a1 are connected in common to the first busbar 6a2. First ends of the second electrode fingers 6b1 are connected in common to the second busbar 6b2.

Reflectors 7 are provided on either side of the IDT electrode 6 in a surface acoustic wave propagation direction. Thus, the series arm resonator S2 that is a one-port elastic wave resonator including a single input terminal and a single output terminal is provided. The series arm resonator S1 and the parallel arm resonators P1 and P2 have a configuration similar to that of the series arm resonator S2.

Referring back to FIG. 2, the capacitive electrode 8 includes a pair of comb-shaped electrodes. One of the comb-shaped electrodes includes a plurality of third electrode fingers 8a1. First ends of the third electrode fingers 8a1 are connected in common to a third busbar 8a2. The other one of the comb-shaped electrodes includes a plurality of fourth electrode fingers 8b1. First ends of the fourth electrode fingers 8b1 are connected in common to a fourth busbar 8b2. The third electrode fingers 8a1 and the fourth electrode fingers 8b1 interdigitate with each other in a cross width direction.

As described above, the capacitive electrode 8 is provided in a lateral direction with respect to the surface acoustic wave propagation direction of the series arm resonator S2. The series arm resonator S2 is closest to the capacitive electrode 8 of the series arm resonators S1 and S2 and the parallel arm resonators P1 and P2. The first busbar 6a2 of the series arm resonator S2 and the third busbar 8a2 of the capacitive electrode 8 are connected via a second wiring line 15. The second busbar 6b2 of the series arm resonator S2 and the fourth busbar 8b2 of the capacitive electrode 8 are connected via a third wiring line 16. The capacitive electrode 8 is therefore connected in parallel to the series arm resonator S2.

The capacitive electrode 8 is located so that the third electrode fingers 8a1 and the fourth electrode fingers 8b1 of the capacitive electrode 8 are perpendicular or substantially perpendicular to the first electrode fingers 6a1 and the second electrode fingers 6b1 of the series arm resonator S2.

FIG. 2 illustrates a state where a first conductive layer is provided on the piezoelectric substrate 2. The first conductive layer corresponds to the second wiring line 15, the third wiring line 16, the capacitive electrode 8, and the connection wiring line 17 provided on the piezoelectric substrate 2. The first conductive layer further corresponds to a plurality of IDT electrodes and a plurality of reflectors included in the series arm resonators S1 and S2 and the parallel arm resonators P1 and P2 described with reference to FIG. 5. In order to provide the first conductive layer, a metal film is formed by, for example, the chemical vapor deposition (CVD) method or the sputtering method. Subsequently, the metal film is subjected to patterning using, for example, the photolithography method.

As illustrated in FIG. 3, an insulating film 9 is laminated on the capacitive electrode 8, the second wiring line, and the third wiring line. In this preferred embodiment, the insulating film 9 is preferably made of $SiO_2$. The insulating film 9 may be an inorganic oxide film other than an $SiO_2$ film, or may be an inorganic nitride film made of, for example, SiN. In order to provide the insulating film 9, an insulating film is formed on an entire surface by, for example, the CVD method or the sputtering method. Subsequently, the insulating film is subjected to patterning using, for example, the photolithography method. The insulating film 9 according to this preferred embodiment may be formed on the entire surface of the first conductive layer. As a result, damage or breaking of the elastic wave apparatus 1 is significantly reduced or prevented.

As illustrated in FIG. 4, the input terminal 3, the output terminal 4, a ground terminal 5 connected to a ground potential, and a first wiring line 14 are provided on the piezoelectric substrate 2. The first wiring line 14 connects the parallel arm resonator P1 and the ground terminal 5. A portion of the first wiring line 14 is provided on the insulating film 9.

Referring to FIG. 4, a second conductive layer is provided on the piezoelectric substrate 2, the insulating film 9, and the first conductive layer. The input terminal 3, the output terminal 4, the ground terminal 5 and the first wiring line 14 correspond to the second conductive layer provided on the piezoelectric substrate 2 and the insulating film 9. The second conductive layer is also provided on busbars of IDT electrodes and the connection wiring line 17 at the first conductive layer. An electrical resistance is therefore reduced.

A first portion 14b that is a portion of the first wiring line 14 provided on the insulating film 9 faces the capacitive electrode 8 via the insulating film 9, so that the capacitance portion 18 is provided.

In order to provide the second conductive layer, a metal film is formed by, for example, the CVD method or the sputtering method. Subsequently, the metal film is subjected to patterning using, for example, the photolithography method.

One of the unique structural features of this preferred embodiment is that the capacitive electrode 8 faces the first wiring line 14 via the insulating film 9 in a thickness direction. An elastic wave apparatus is therefore able to be reduced in size. This will be described below.

Figure 6:
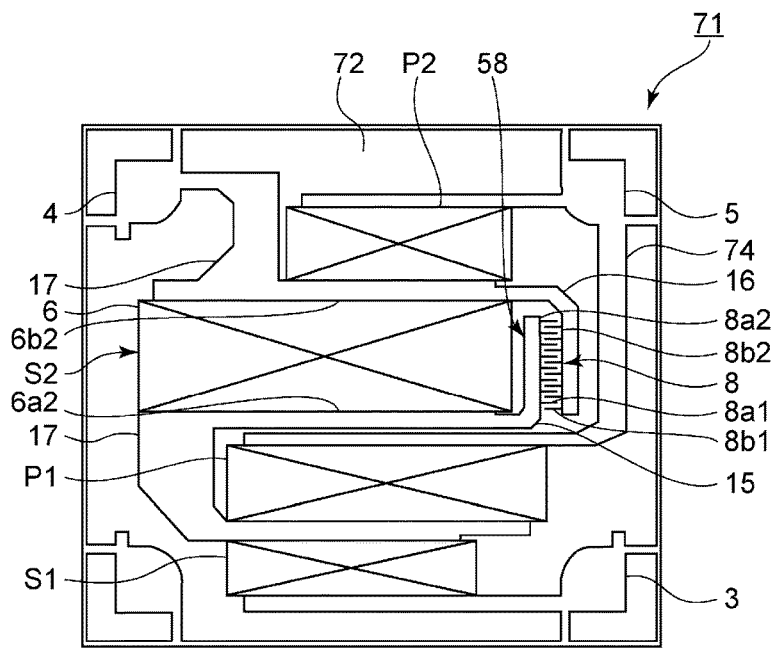
FIG. 6 is a schematic plan view of an elastic wave apparatus that is a first comparative example.

FIG. 6 is a schematic plan view of an elastic wave apparatus that is a first comparative example.

In the first comparative example, the entirety of a first wiring line 74 is provided on a piezoelectric substrate 72. The capacitive electrode 8 and the first wiring line 74 are provided on the piezoelectric substrate 72. The area of an elastic wave apparatus 71 is therefore large.

In contrast, as illustrated in FIGS. 2 to 4, the first portion 14b of the first wiring line 14 and the capacitive electrode 8 face each other via the insulating film 9 in a thickness direction in this preferred embodiment. The first wiring line 14 also faces the second wiring line 15 and the third wiring line 16 via the insulating film 9. The footprint of the first wiring line 14 on the piezoelectric substrate 2 is therefore able to be reduced. This leads to the size reduction of the elastic wave apparatus 1.

The insulating film 9 may be provided at least on the third electrode fingers 8a1 and the fourth electrode fingers 8b1 of the capacitive electrode 8.

The capacitance portion 18 is connected in parallel to the series arm resonator S2. The capacitance portion 18 includes the capacitive electrode 8, the insulating film 9 provided on the capacitive electrode 8, and the first wiring line 14 facing the capacitive electrode 8 via the insulating film 9. An electrostatic capacitance is therefore further added to the capacitive electrode 8 in the capacitance portion 18. Accordingly, an electrostatic capacitance added to the series arm resonator S2 is effectively increased. As a result of the addition of an electrostatic capacitance by the capacitance portion 18, the anti-resonance point of the series arm resonator S2 is able to be moved to a lower-frequency side.

Therefore, the steepness around the end portion of a passband of the elastic wave apparatus 1 on a higher-frequency side is able to be effectively increased.

In this preferred embodiment, an electrostatic capacitance is further added to the capacitive electrode 8 in the capacitance portion 18. For example, in order to obtain the same electrostatic capacitance as a capacitance portion 58 that is a first comparative example, it is possible to reduce the area of the capacitive electrode 8. The elastic wave apparatus 1 is therefore able to be further reduced in size.

The capacitive electrode 8 is located so that the third electrode fingers 8a1 and the fourth electrode fingers 8b1 are perpendicular or substantially perpendicular to the first electrode fingers 6a1 and the second electrode fingers 6b1 of the series arm resonator S2. The propagation direction of a surface acoustic wave excited in the capacitive electrode 8 is therefore perpendicular or substantially perpendicular to the propagation direction of surface acoustic waves excited in the series arm resonators S1 and S2 and the parallel arm resonators P1 and P2. The surface acoustic wave excited in the capacitive electrode 8 and the surface acoustic waves excited in the series arm resonators S1 and S2 and the parallel arm resonators P1 and P2 hardly interfere with one another. It is therefore possible to effectively reduce the effect of the surface acoustic wave excited in the capacitive electrode 8 upon the series arm resonators S1 and S2 and the parallel arm resonators P1 and P2.

The capacitive electrode may be located so that lines extended from the third electrode fingers and the fourth electrode fingers are perpendicular or substantially perpendicular to lines extended from the first electrode fingers and the second electrode fingers of the series arm resonators and the parallel arm resonators. Also in this case, it is possible to reduce the effect of the surface acoustic wave excited in the capacitive electrode upon the series arm resonators and the parallel arm resonators. However, it is more desirable to place the capacitive electrode 8 so that the third busbar 8a2 and the fourth busbar 8b2 of the capacitive electrode 8 are perpendicular or substantially perpendicular to the first busbar 6a2 and the second busbar 6b2 of the series arm resonator S2 like in this preferred embodiment.

The capacitive electrode 8 extends in a lateral direction with respect to the series arm resonator S2. A direction in which the first wiring line 14 extends and a direction in which the third busbar 8a2 and the fourth busbar 8b2 of the capacitive electrode 8 extend are therefore able to be parallel or substantially parallel to each other. The lengths of the third busbar 8a2 and the fourth busbar 8b2 are therefore able to be increased. The number of pairs of the third electrode finger 8a1 and the fourth electrode finger 8b1 are therefore able to be increased without changing the distance between the third electrode finger 8a1 and the fourth electrode finger 8b1. The area of a portion where the capacitive electrode 8 and the first wiring line 14 face each other are therefore able to be increased. As a result, the electrostatic capacitance of the capacitance portion 18 is effectively increased.

By increasing the lengths of the third busbar 8a2 and the fourth busbar 8b2 and increasing the number of pairs of the third electrode finger 8a1 and the fourth electrode finger 8b1, it is possible to increase the areas of crossing portions between the third electrode finger 8a1 and the fourth electrode finger 8b1. The electrostatic capacitance of the capacitive electrode 8 is therefore able to be also effectively increased.

The lengths of the third busbar 8a2 and the fourth busbar 8b2 of the capacitive electrode 8 may be increased, the number of pairs of the third electrode finger 8a1 and the fourth electrode finger 8b1 may be increased, and the lengths of crossing portions between the third electrode finger 8a1 and the fourth electrode finger 8b1 may be reduced. As a result, an electrical resistance is effectively reduced without reducing the electrostatic capacitance of the capacitive electrode 8. In addition, an elastic wave apparatus is reduced in size.

Figure 7:
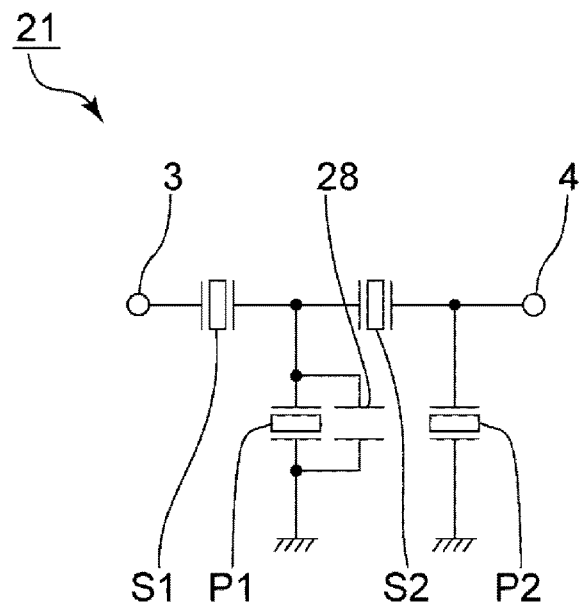
FIG. 7 is a circuit diagram of an elastic wave apparatus according to a second preferred embodiment of the present invention.

FIG. 7 is a circuit diagram of an elastic wave apparatus according to a second preferred embodiment of the present invention.

An elastic wave apparatus 21 differs from an elastic wave apparatus according to the first preferred embodiment in that a capacitance portion 28 is connected in parallel to the parallel arm resonator P1. Except for this point, a configuration according to the second preferred embodiment is preferably the same or substantially the same as that according to the first preferred embodiment.

A configuration according to the second preferred embodiment will be described in more detail below with reference to FIGS. 8 to 10.

Figure 9:
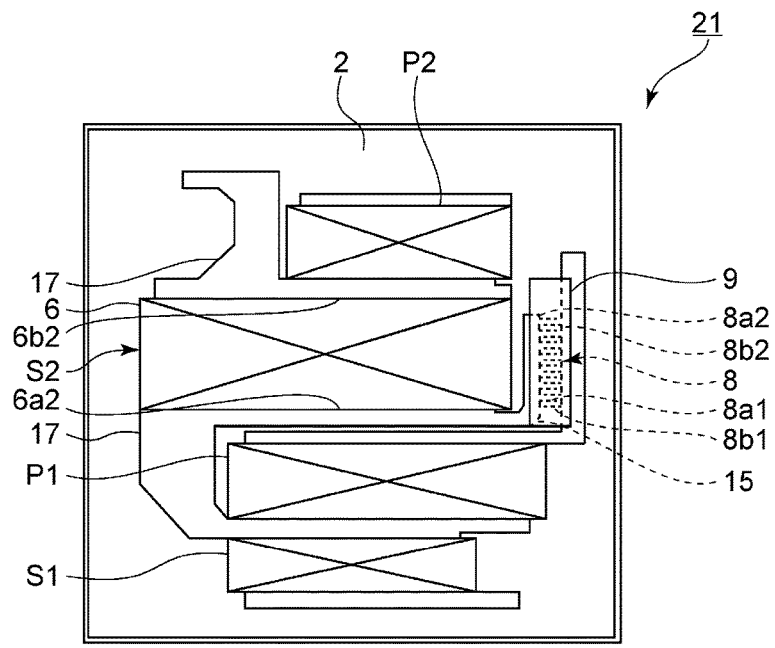
FIG. 9 is a schematic plan view illustrating a state where an insulating film is provided on the first conductive layer illustrated in FIG. 8 in the second preferred embodiment of the present invention.
Figure 10:
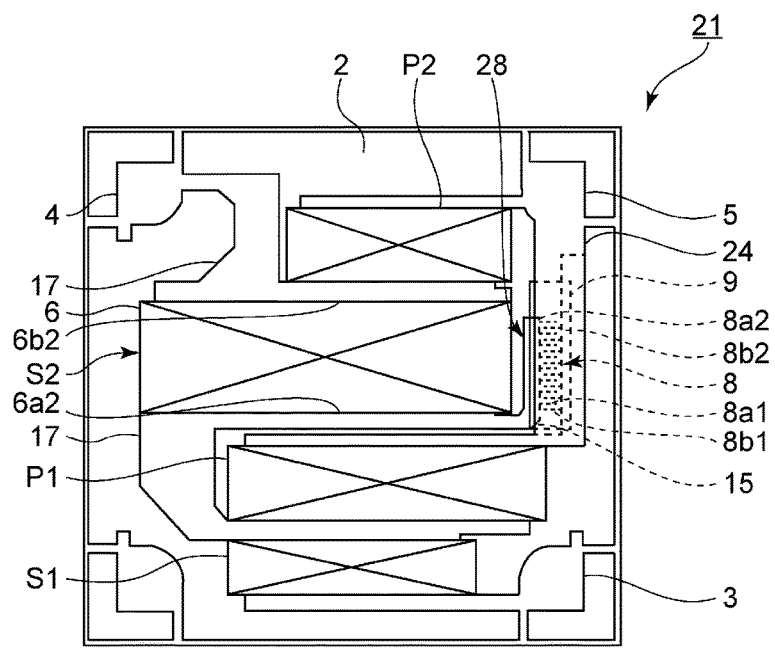
FIG. 10 is a schematic plan view of an elastic wave apparatus according to the second preferred embodiment of the present invention.

FIG. 10 is a schematic plan view of an elastic wave apparatus according to this preferred embodiment. FIGS. 8 and 9 are diagrams illustrating configurations at stages during the process of manufacturing an elastic wave apparatus according to this preferred embodiment. More specifically, FIG. 8 is a schematic plan view illustrating a state where a first conductive layer is provided on a piezoelectric substrate, and FIG. 9 is a schematic plan view illustrating a state where an insulating film is provided on the first conductive layer illustrated in FIG. 8.

As illustrated in FIG. 10, the second busbar 6b2 of the series arm resonator S2 and the fourth busbar 8b2 of the capacitive electrode 8 are not connected and the fourth busbar 8b2 is connected to the ground terminal 5 in the elastic wave apparatus 21. A portion of a first wiring line 24 is provided not only on the insulating film 9 but also on the fourth busbar 8b2. Thus, the first wiring line 24 and the fourth busbar 8b2 are connected. The capacitive electrode 8 and the first wiring line 24 face each other via the insulating film 9, so that the capacitance portion 28 is provided.

Figure 11:
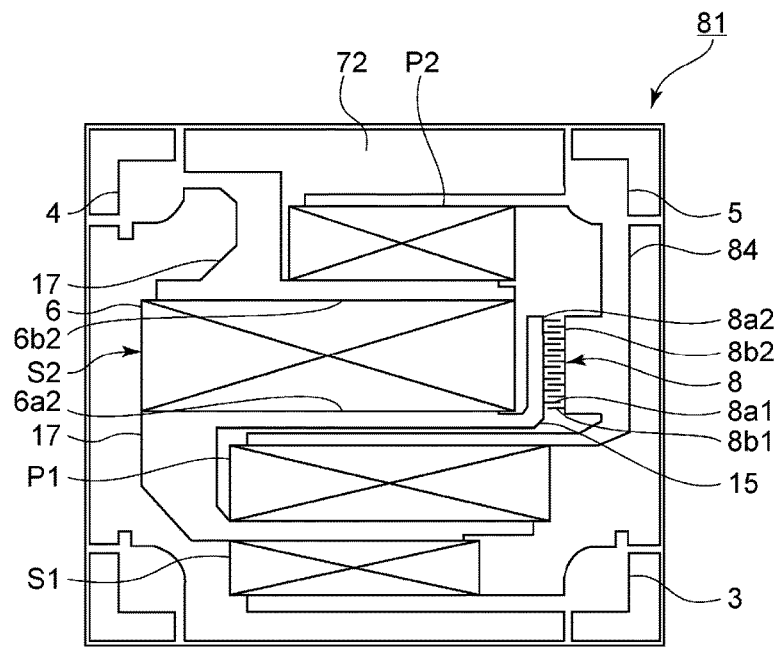
FIG. 11 is a schematic plan view of an elastic wave apparatus that is a second comparative example.

In a second comparative example illustrated in FIG. 11, the whole of a first wiring line 84 is provided on the piezoelectric substrate 72. Since the capacitive electrode 8 and the first wiring line 84 are provided on the piezoelectric substrate 72, the area of an elastic wave apparatus 81 is large.

Figure 8:
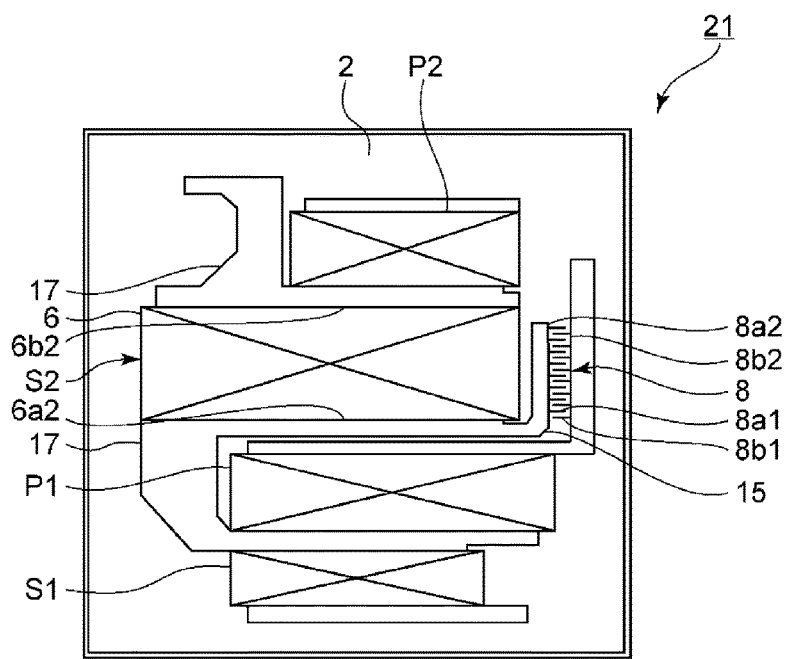
FIG. 8 is a schematic plan view illustrating a state where a first conductive layer is provided on a piezoelectric substrate in the second preferred embodiment of the present invention.

In contrast, as illustrated in FIGS. 8 to 10, the first wiring line 24 faces the capacitive electrode 8 via the insulating film 9 and is provided on the fourth busbar 8b2 in this preferred embodiment. The footprint of the first wiring line 24 on the piezoelectric substrate 2 is therefore able to be reduced. As a result, the elastic wave apparatus 21 is able to be reduced in size.

As described above, the capacitance portion 28 is connected in parallel to the parallel arm resonator P1. The capacitance portion 28 includes the capacitive electrode 8, the insulating film 9 provided on the capacitive electrode 8, and the first wiring line 24 facing the capacitive electrode 8 via the insulating film 9. An electrostatic capacitance is therefore further added to the capacitive electrode 8 in the capacitance portion 28. Accordingly, an electrostatic capacitance added to the parallel arm resonator P1 is able to be effectively increased. As a result of the addition of an electrostatic capacitance by the capacitance portion 28, the anti-resonance point of the parallel arm resonator P1 is moved to a lower-frequency side. Therefore, by adjusting the frequency of the parallel arm resonator P1, the steepness around the end portion of a passband of the elastic wave apparatus 21 on a lower-frequency side is effectively increased.

Like in the first preferred embodiment, an electrostatic capacitance is further added to the capacitive electrode 8 in the capacitance portion 28 in this preferred embodiment. The area of the capacitive electrode 8 is therefore reduced. This leads to the size reduction of the elastic wave apparatus 21.

Next, a third preferred embodiment of the present invention will be described with reference to FIGS. 12 and 13.

Figure 12:
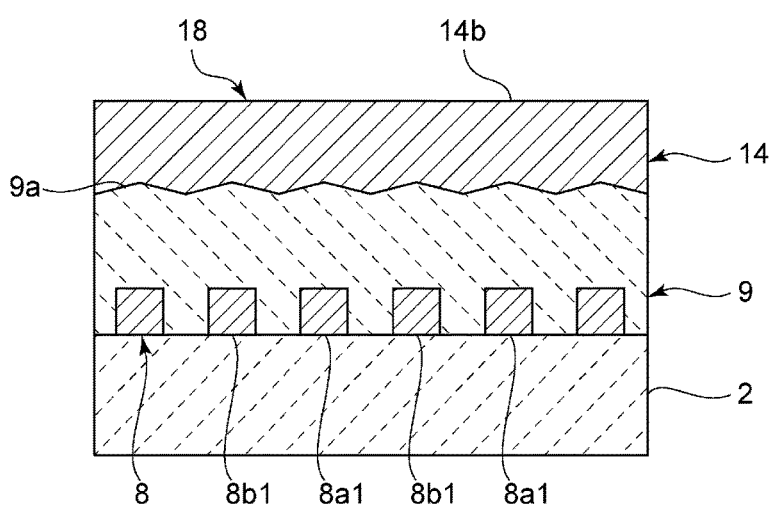
FIG. 12 is a cross-sectional view of an elastic wave apparatus taken along a line A-A in FIG. 4.

FIG. 12 is a cross-sectional view of an elastic wave apparatus taken along a line A-A in FIG. 4. FIG. 13 is a partial cross-sectional view of a portion of an elastic wave apparatus according to the third preferred embodiment in which a capacitive electrode is provided.

As illustrated in FIG. 12, the insulating film 9 follows an uneven shape made by the third electrode fingers 8$a$1 and the fourth electrode fingers 8$b$1 of the capacitive electrode 8 on the piezoelectric substrate 2 in the first preferred embodiment. An upper surface 9$a$ of the insulating film 9 therefore has an uneven shape. As described above, the insulating film 9 is preferably made of $SiO_2$.

Figure 13:
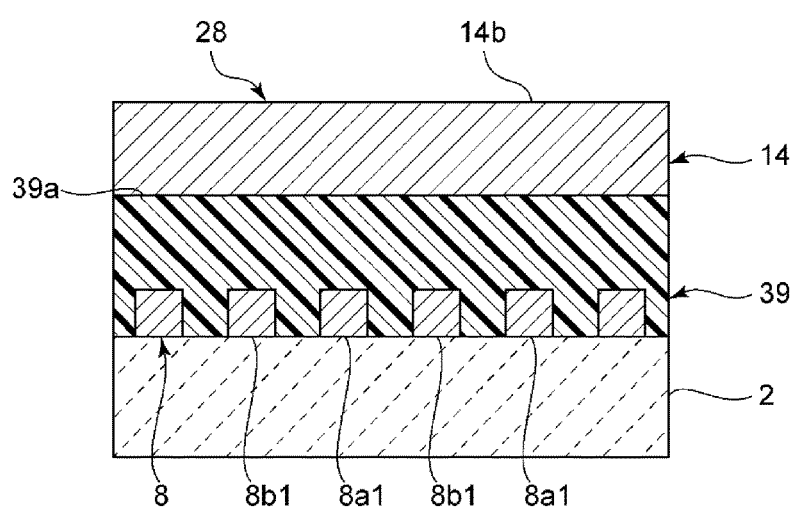
FIG. 13 is a partial cross-sectional view of a portion of an elastic wave apparatus according to a third preferred embodiment of the present invention in which a capacitive electrode is provided.

An insulating film 39 according to the third preferred embodiment illustrated in FIG. 13 is preferably made of polyimide. The insulating film 39 may be made of an insulating material having no piezoelectricity, for example, a resin other than polyimide. Except for this point, a configuration according to the third preferred embodiment is the same as that according to the first preferred embodiment.

In this preferred embodiment, the insulating film 39 is provided on the capacitive electrode 8 and is not provided on the series arm resonators and the parallel arm resonators.

Since the insulating film 39 is preferably made of a resin in the third preferred embodiment, the insulating film 39 does not follow an uneven shape made by the third electrode fingers 8$a$1 and the fourth electrode fingers 8$b$1 of the capacitive electrode 8 on the piezoelectric substrate 2. An upper surface 39$a$ of the insulating film 39 may have a flat shape. The first wiring line 14 is therefore able to be easily provided on the upper surface 39$a$ of the insulating film 39. This effectively increases productivity.

Like in the first preferred embodiment, the first conductive layer is provided on the piezoelectric substrate 2 and then the insulating film 39 is provided on the first conductive layer in this preferred embodiment. The insulating film 39 is able to be provided by, for example, printing or the photo-lithography method.

Like in the first preferred embodiment, the second conductive layer is provided after the insulating film 39 has been provided. It is desired that a protection film made of, for example, $SiO_2$ be formed on the first wiring line 14 and the first conductive layer after the formation of the second conductive layer. As a result, damage or breakage of the elastic wave apparatus is significantly reduced or prevented.

Figure 14:
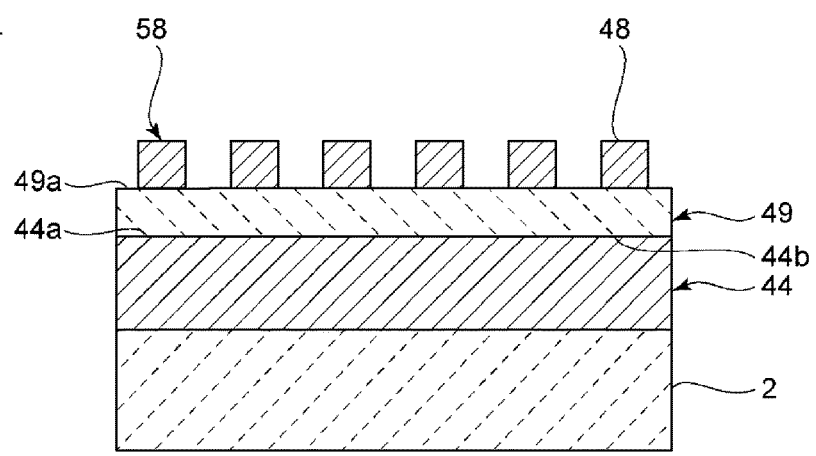
FIG. 14 is a partial cross-sectional view of a portion of an elastic wave apparatus according to a fourth preferred embodiment of the present invention in which a capacitive electrode is provided.

FIG. 14 is a partial cross-sectional view of a portion of an elastic wave apparatus according to a fourth preferred embodiment in which a capacitive electrode is provided.

The fourth preferred embodiment differs from the first preferred embodiment in that the entirety of a first wiring line 44 is provided on the piezoelectric substrate 2 and a portion of a capacitive electrode 48 is not provided on the piezoelectric substrate 2. Except for this point, a configuration according to this preferred embodiment is the same as that according to the first preferred embodiment.

An insulating film 49 made of, for example, $SiO_2$ is provided on the first wiring line 44 on the piezoelectric substrate 2. On the insulating film 49, the capacitive electrode 48 is provided. That is, the first wiring line 44 corresponds to the first conductive layer provided concurrently with the provision of each IDT electrode and each reflector. The capacitive electrode corresponds to the second conductive layer provided concurrently with the provision of the input terminal, the output terminal, and the ground terminal. A first portion 44$b$ that is a portion of the first wiring line 44 and the capacitive electrode 48 face each other via the insulating film 49.

The first portion 44$b$ of the first wiring line 44 and the capacitive electrode 48 face each other via the insulating film 49, so that the capacitance portion 58 is provided. An effect similar to that obtained in the first preferred embodiment is therefore obtained.

Since an upper surface 44$a$ of the first wiring line 44 is flat, an upper surface 49$a$ of the insulating film 49 provided on the first wiring line 44 is also flat. The capacitive electrode 48 is therefore able to be easily provided on the upper surface 49$a$ of the insulating film 49. This effectively increases productivity.

Figure 15:
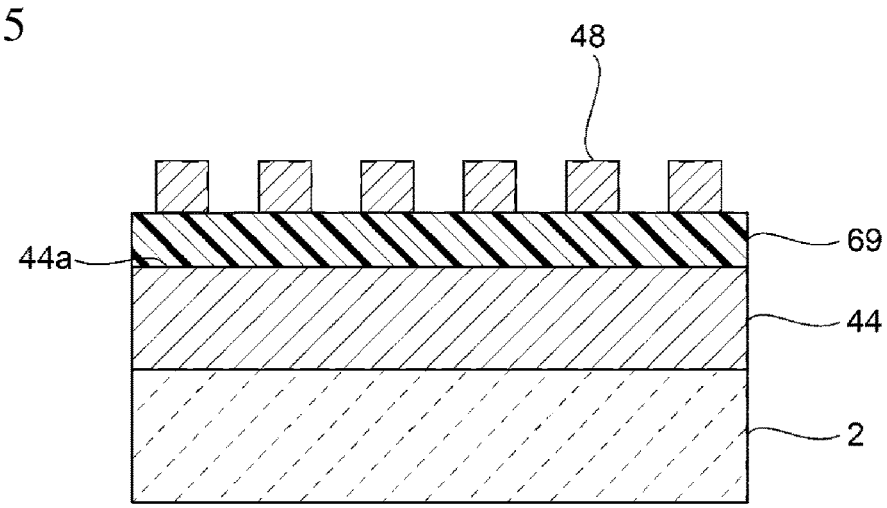
FIG. 15 is a partial cross-sectional view of a portion of an elastic wave apparatus that is a modification of the fourth preferred embodiment of the present invention in which a capacitive electrode is provided.

Like in a modification illustrated in FIG. 15, an insulating film 69 may be made of an insulating material having no piezoelectricity, for example, polyimide or a resin other than polyimide. Also in this case, an effect similar to that obtained in the fourth preferred embodiment is obtained.

Although a case where an elastic wave apparatus preferably is a ladder filter has been described in the first to fourth preferred embodiments, an elastic wave apparatus according to a preferred embodiment of the present invention may be a one-port resonator. An elastic wave apparatus according to a preferred embodiment of the present invention is not limited to a surface acoustic wave apparatus, and may be a boundary acoustic wave apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave apparatus comprising:
   a piezoelectric substrate;
   an IDT electrode that is provided on the piezoelectric substrate and includes a plurality of first electrode fingers and a plurality of second electrode fingers which interdigitate with each other, a first busbar to which first ends of the first electrode fingers are connected in common, and a second busbar to which first ends of the second electrode fingers are connected in common;
   a capacitive electrode including a plurality of third electrode fingers and a plurality of fourth electrode fingers which interdigitate with each other, a third busbar to which first ends of the third electrode fingers are connected in common, and a fourth busbar to which first ends of the fourth electrode fingers are connected in common;
   an insulating film provided on the capacitive electrode;
   a first wiring line including a portion facing the capacitive electrode via the insulating film; and
   a second wiring line that connects the first busbar and the third busbar; wherein
   the capacitive electrode extends in a lateral direction with respect to the IDT electrode in a surface acoustic wave propagation direction; and the portion of the first wiring line overlaps the capacitive electrode with the insulating film disposed therebetween when the piezoelectric substrate is viewed in plan view.

2. The elastic wave apparatus according to claim 1, wherein
the elastic wave apparatus is a ladder filter including at least one series arm resonator and at least one parallel arm resonator; and
at least one of the series arm resonator and the parallel arm resonator includes the IDT electrode.

3. The elastic wave apparatus according to claim 2, wherein the capacitive electrode is located so that a propagation direction of a surface acoustic wave excited in the capacitive electrode is perpendicular or substantially perpendicular to a propagation direction of surface acoustic waves excited in the at least one series arm resonator and the at least one parallel arm resonator.

4. The elastic wave apparatus according to claim 2, wherein the capacitive electrode and the first wiring line face each other via the insulating film to define a capacitance portion, and the capacitance portion is connected in parallel to the at least one parallel arm resonator.

5. The elastic wave apparatus according to claim 1, wherein the fourth busbar is connected to a ground potential.

6. The elastic wave apparatus according to claim 5, wherein the first wiring line is connected to the fourth busbar.

7. The elastic wave apparatus according to claim 1, wherein the capacitive electrode is located so that a cross width direction of the third electrode fingers and the fourth electrode fingers is not parallel to a cross width direction of the first electrode fingers and the second electrode fingers.

8. The elastic wave apparatus according to claim 7, wherein the capacitive electrode is located so that a cross width direction of the third electrode fingers and the fourth electrode fingers is perpendicular or substantially perpendicular to a cross width direction of the first electrode fingers and the second electrode fingers.

9. The elastic wave apparatus according to claim 1, further comprising a third wiring line that connects the second busbar and the fourth busbar.

10. The elastic wave apparatus according to claim 1, wherein the portion of the first wiring line facing the capacitive electrode is provided on the piezoelectric substrate.

11. The elastic wave apparatus according to claim 1, wherein the capacitive electrode is provided on the piezoelectric substrate.

12. The elastic wave apparatus according to claim 1, wherein the insulating film is made of an insulating material having no piezoelectricity.

13. The elastic wave apparatus according to claim 1, wherein at least two series arm resonators and at least two parallel arm resonators are provided on the piezoelectric substrate and connected by a connection wiring line.

14. The elastic wave apparatus according to claim 1, further comprising reflectors provided on the piezoelectric substrate at both ends of the IDT electrode.

15. The elastic wave apparatus according to claim 1, wherein a capacitance portion is defined by a portion of the first wiring line on the insulating film that faces the capacitive electrode via the insulating film in a thickness direction.

16. The elastic wave apparatus according to claim 1, wherein the insulating film is provided at least on the third electrode fingers and the fourth electrode fingers of the capacitive electrode.

17. The elastic wave apparatus according to claim 1, wherein the capacitive electrode is located so that the third electrode fingers and the fourth electrode fingers are perpendicular or substantially perpendicular to the first electrode fingers and the second electrode fingers.

18. The elastic wave apparatus according to claim 1, wherein lines extended from the third electrode fingers and the fourth electrode fingers are perpendicular or substantially perpendicular to lines extended from the first electrode fingers and the second electrode fingers.

19. The elastic wave apparatus according to claim 1, wherein a direction in which the first wiring line extends and a direction in which the third busbar and the fourth busbar of the capacitive electrode extend are parallel or substantially parallel to each other.

20. The elastic wave apparatus according to claim 1, wherein
the second busbar and the fourth busbar are not connected;
the fourth busbar is connected to a ground terminal;
a portion of a first wiring line is provided on the insulating film and the fourth busbar; and
the first wiring line and the fourth busbar are connected.

* * * * *